United States Patent
Purlys et al.

(10) Patent No.: US 9,530,650 B2
(45) Date of Patent: Dec. 27, 2016

(54) METHOD OF CREATION OF DEFECTS USING X-RAY RADIATION AND ELECTRIC FIELD AND ITS APPLICATION

(71) Applicant: VILNIUS UNIVERSITY, Vilnius (LT)

(72) Inventors: Romaldas Purlys, Vilnius (LT); Arvydas Juozapas Janavicius, Siauliai (LT); Vitalij Balandin, Vilnius (LT); Mindaugas Viliunas, Vilnius (LT); Saulius Balakauskas, Vilnius (LT); Andrius Poskus, Vilnius (LT)

(*) Notice: Subject to any disclaimer, the term of this patent is extended or adjusted under 35 U.S.C. 154(b) by 0 days.

(21) Appl. No.: 14/436,934

(22) PCT Filed: Oct. 16, 2013

(86) PCT No.: PCT/LT2013/000017
§ 371 (c)(1),
(2) Date: Apr. 20, 2015

(87) PCT Pub. No.: WO2014/062045
PCT Pub. Date: Apr. 24, 2014

(65) Prior Publication Data
US 2015/0262821 A1    Sep. 17, 2015

(30) Foreign Application Priority Data
Oct. 18, 2012    (LT) .................................... 2012 094

(51) Int. Cl.
| | | |
|---|---|---|
| *H01L 21/00* | (2006.01) | |
| *H01L 21/268* | (2006.01) | |
| *H01L 21/263* | (2006.01) | |
| *H01L 21/326* | (2006.01) | |
| *H01L 31/068* | (2012.01) | |
| *H01L 31/18* | (2006.01) | |
| *H01L 21/22* | (2006.01) | |

(52) U.S. Cl.
CPC .......... *H01L 21/2683* (2013.01); *H01L 21/22* (2013.01); *H01L 21/263* (2013.01); *H01L 21/326* (2013.01); *H01L 31/068* (2013.01); *H01L 31/1804* (2013.01); *Y02E 10/547* (2013.01); *Y02P 70/521* (2015.11)

(58) Field of Classification Search
CPC .... H01L 21/2683; H01L 21/22; H01L 21/263; H01L 21/326
USPC ........................................................ 438/795
See application file for complete search history.

(56) References Cited

PUBLICATIONS

A.J. Janavicius "Superdiffusion in Si Crystal Lattice Irradiated by Soft X-Rays" vol. 114 (2008) ACTA Physica Polonica A pp. 779-790.*

* cited by examiner

*Primary Examiner* — Bradley K Smith
(74) *Attorney, Agent, or Firm* — Young & Thompson

(57) ABSTRACT

The goal is the improvement of technologies of modification of material properties by decreasing expenditures of energy and time and extending possibilities for modification of the materials by creating and maintaining a metastable state, which is characterized by a change in the structure of the material. The invention belongs to the technological field of manufacturing materials with desired properties, and in part to the field of methods of defect generation in crystals, and it can be applied in industries that apply the process of material doping with impurities in order to manufacture materials having a desired concentration of defects and an increased concentration of charge carriers, to create a metastable structural state of the material, as well as to measure energy and doses of radio waves.

10 Claims, 3 Drawing Sheets

METHOD OF CREATION OF DEFECTS USING X-RAY RADIATION AND ELECTRIC FIELD AND ITS APPLICATION

FIELD OF THE INVENTION

The invention belongs to the technological field of manufacturing method of materials with desired properties, in part—methods of defect generation in crystals, and it can be applied in industries that apply process of material doping with impurities in manufacturing materials having a desired concentration of defects.

BACKGROUND OF THE INVENTION

The modern semiconductor industry relies on potential to change properties of materials by introduction of impurities and creation or elimination of structural defects in lattices. The predominant type of defect is a vacancy created when chemical bonds between neighboring atoms are broken. A vacancy is a relatively long-lived object, characterized by absence of an atom from a lattice node. Vacancies can be created by ionizing radiation, either directly (when a high-energy massive particle "knocks out" an atom from a lattice node into an interstitial position), or indirectly, when the atom is at first excited due to Auger effect caused by X-rays, whereupon the double ionization of the atom causes a change of the force of its interaction with neighbouring atoms and an increase of the probability that the atom will leave the lattice node due to random thermal motion (this is how X-ray radiation creates vacancies). Diffusion of vacancies is caused by thermally-stimulated "jumps" of atoms into neighbouring vacant positions (i.e., vacant and occupied positions of lattice nodes are interchanged, which is equivalent to spatial motion of the vacancy).

The broken chemical bonds responsible for existence of a vacancy are called "dangling bonds". Vacancies greatly facilitate diffusion of dopant atoms. Normally, a sufficiently high rate of diffusion can only be achieved when the material is heated to a high temperature (approximately 1000°). Vacancies can lower the required temperature substantially. However, in order to be able to apply this property in practice, vacancies must be sufficiently long-lived (i.e., metastable). At favorable conditions, extremely fast diffusion (the so-called "superdiffusion") can be achieved even at room temperature.

During investigation of nonlinear diffusion in excited systems (A. J. Janavičius, Lith. J. of Phys., 37, 508-510 (1997)), attention was drawn to fast thermal diffusion of indium in a p-type HgCdTe/CdTe crystal excited by ultraviolet-radiation photons with energy of 4.14 eV emitted by a mercury-halogen lamp. This very fast diffusion was discovered experimentally and described in the paper Seung-Man-Park et al, Jpn. J. Appl. Phys., 35, 1554 (1996). By applying the method of secondary ion mass spectroscopy, indium fast diffusion profiles corresponding to extremely low activation energy have been measured (the measurements were carried out at temperatures of 120° C., 150° C., 180° C.). Since only about 1% of indium atoms participated in fast diffusion, no practical application for the discovered phenomenon was found, despite the fact that those atoms reached depth of 12 μm faster than in 30 s. However, those results have a theoretical value, because they demonstrate the possibility to initiate superdiffusion using photon radiation.

One of current topics of research is superdiffusion initiated by particle beams, when impurities are being introduced after bombarding the sample with fast electrons, protons and slow neutrons. This type of superdiffusion can be only partially considered to be diffusion, because it involves knocking out of atoms from nodes of a crystal lattice. Neutron beams have been used to introduce impurities during manufacture of diodes and solar cells, but p-n junctions obtained by this method have many defects and are close to a surface of a sample. Fast particles damage a lattice, create a multitude of defects and change the surface structure, they may cause formation of an amorphous layer at a surface of a crystal. Consequently, applications of superdiffusion initiated by particle beams for manufacture of electronic devices are currently of purely experimental character.

We used soft X-ray radiation for creation of metastable vacancies in Si lattice by means of the Auger effect. We discovered experimentally boron and phosphorus superdiffusion via metastable vacancies in crystalline silicon at a room temperature. On the basis of superdiffusion of this type, we can propose promising technologies for manufacturing of high-quality electronic devices (photodiodes, solar cells).

This important conclusion was made by comparing our results with superdiffusion initiated by fast electrons. Control of doping profiles using fast electron technology is described in the paper by Takao Wada and Hiroshi Fujimoto "Electron Beam Doping of Impurity Atoms into Semiconductors by Superdiffusion, Phys stat. sol. (c) 0, No. 2, 788-794 (2003)". The investigations described in that article were performed with extremely thin diffusion layers (layer thickness 50 to 400 Å), which are difficult to apply in practice. Fast-diffusing and long-lived (at room temperature) vacancies generated with soft X rays (A. J. Janavičius, J. Banys, R. Purlys, and S. Balakauskas, Lithuanian Journal of Physics 42, No 5, 337 (2002)) can be used for deep doping of semiconductors. The nonlinear diffusion theory, presented in the article A. J. Janavičius, Phys. Lett. A., 224, 159-162, (1997), suggests new experimental methods of investigation of point defects, using electric and Bragg diffraction measurements. The method of superdiffusion in excited systems, which was presented in the article A. J. Janavičius, Acta Phys. Pol. A 93, 505 (1998), is fundamentally different from superdiffusion initiated by fast electrons and other particles. Superdiffusion, which is initiated by fast electrons (1-2 MeV), protons, gamma rays or other particles, not only creates vacancies and Frenkel pairs, but it also introduces oxygen complexes, which damage the region of the sample and render it unsuitable for manufacture of electronic devices. When crystals are exposed to fast particles, a large amount energy is transferred to the lattice. This energy contributes to the energy of lattice vibrations, decreases the time of existence of vacancies and the probability to participate in diffusion. Vacancies that are generated by soft X-rays are long-lived (more than 1.5 h) at a room temperature and can be applied in practice. Generation of superdiffusion of impurities in semiconductors using soft X-rays with the aim to create novel devices (photodiodes, solar cells) is a complex process, which depends on properties of a crystal, type of impurities used and vacancy charges. Therefore, further theoretical and experimental studies are needed. Long-lived and fast-diffusing vacancies are the reason of phosphorus and boron superdiffusion in p-type silicon crystals at room temperature. The resonances of vacancy dangling bonds under action of alternating radio-frequency electric field are fundamentally new phenomena, which are presented for patenting herein.

A known doping method, which is described in the U.S. Pat. No. 4,824,798, is based on generation of vacancies at a high temperature (up to 900° C.) using an oven. The drawback of this method is a large expenditure of energy and time (approximately 8 hours).

A method of manufacturing light-emitting diodes, which is described in the U.S. Pat. No. No. 4,639,275, is based on diffusion of zinc ions at a high temperature (750° C. to 1050° C.) in a heterojunction formed of III-IV semiconductors (in this case, those ions are needed for creation of a disordered layer and a consequent increase of the energy gap of the material).

The U.S. Pat. No. 4,843,033 describes a different method of zinc ion diffusion into GaAs substrates, which is based on deposition of a zinc tungsten silicide ($W_xSi:Zn$) layer on GaAs surface and heating at a temperature of 600° C. to 700° C.

Another widespread method of semiconductor doping is ion implantation. Its main drawback is the fact that high-energy ions knock the atoms out of a lattice nodes, i.e., damage the crystal lattice. In order to restore regular positions of atoms, annealing is necessary after the implantation (a typical annealing temperature is approximately 800° C.). Some implantation techniques are designed to minimize the damage done to the semiconductor due to implantation. For example, the U.S. Pat. No. 4,927,773 describes a method based on coating the semiconductor with a layer of another material, which is used as a target of ion implantation, whereupon thermal diffusion from that additional layer into the semiconductor is carried out. In this case, the additional layer protects the semiconductor from damage, and the annealing temperature can be as low as 250° C. However, the annealing time is still rather long—up to 16 hours.

The closest technical solution, which has been chosen as the analogue of this invention, is the method of vacancy generation during doping processes using X-ray radiation. Using this method, the following operations are performed: a layer consisting of the chemical element that is to be introduced into the bulk of a material is deposited on a crystalline sample of the just-mentioned material, then the crystal is exposed to X-rays (A. J. Janavičius, S. Balakauskas, V. Kazlauskienė, A. Mekys, R. Purlys and J. Storasta. Superdiffusion in Si Crystal Lattice Irradiated by Soft X-Rays. Acta Phys. Polon. A. ISSN 0587-4246. Vol. 114, No. 4 (2008), p. 779-790). Vacancies generated by soft X-rays are characterized by fast diffusion and long lifetimes at a room temperature (A. J. Janavičius, J. Banys, R. Purlys, and S. Balakauskas, Lithuanian Journal of Physics 42, No 5, 337 (2002)), hence they can be used for deep doping of semiconductors.

The drawback of this method is that vacancies diffusion only takes place at specific operation conditions of the X-ray tube (anode voltage of 9 kV and anode current of 23 mA). The method is very sensitive to X-ray tube anode current and voltage as well as to X-ray flux incident on the surface. As anode current grows to 30 mA, diffusion of vacancies decrease several times and eventually disappear completely at larger values of anode current. Diffusion of vacancies also disappear after increasing voltage by 1-2 kV. As a result, gradual change of equipment parameters with time, which causes a corresponding change of radiation flux, makes it difficult to find the optimal operation conditions. Besides, when vacancies are created by this method, the process of their diffusion into the bulk of the exposed material takes from 1 to 6 hours. Our invention includes using a high-frequency electric field, which acts upon the material exposed to X-ray radiation. It is used for fast saturation of vacancy concentration in a material in order to create favorable conditions for diffusion of impurities. This method makes it possible to achieve fast diffusion of impurities in any material, because there is no need for heating it. Since diffusion of impurities is fast, the destructive effect of radiation is insignificant. In comparison with the closest analogue, the proposed new method of speeding up the diffusion of impurities is more technological and has a wider area of potential applications. Using superdiffusion of this type, it is possible to propose promising technologies for manufacture of high-quality electronic devices (photodiodes, solar cells).

DESCRIPTION OF THE INVENTION

The modern semiconductor industry is dependent on potential to change material properties by introduction of impurities and generation or removal of structural defects in lattices. Using X-rays for creation of metastable vacancies in Si lattice by means of the Auger effect, superdiffusion of phosphorus and boron via metastable vacancies in crystalline silicon at room temperature was discovered experimentally.

The earlier studies (A. J. Janavičius, S. Balakauskas, V. Kazlauskienė, A. Mekys, R. Purlys and J. Storasta. Superdiffusion in Si Crystal Lattice Irradiated by Soft X-Rays. Acta Phys. Polon. A. ISSN 0587-4246. Vol. 114, No. 4 (2008), p. 779-790) showed that it is possible to introduce impurities into the bulk of a semiconductor using X-ray radiation. Since such diffusion of impurities does not require heating, this method is more practical than conventional methods of vacancy generation and doping with impurities, which require large expenditure of energy and time. This problem has been solved using X-ray-generated vacancies and an X-ray tube operation mode that is optimized for each material. That operation mode is chosen so as to create favorable conditions for vacancy formation and their diffusion into bulk of a crystal. This process is accompanied by a change of the diffraction spectrum intensity, which can change by a factor of up to ~100. However, the process of filling bulk of a monocrystal with vacancies takes several hours (FIG. 1), and different materials require different X-ray tube operation conditions. FIG. 1 shows the time dependence of intensity of the diffraction spectrum peak corresponding to reflection of Cu $K_\alpha$ radiation from Si (333) crystallographic planes. Evidently, vacancy generation causes a decrease of diffraction intensity, which indicates an increasing degree of disorder in the structure of the crystal lattice. This is a result of generation of point defects. We can see that saturation of bulk crystal with vacancies requires a 6-hour-long process of vacancy excitation. It is desirable to find ways to make this process less time-consuming, which would simplify the applications of defect diffusion for development of doping technologies.

The goal of the invention is an improvement of the technology of defect generation and deep doping of semiconductors at room temperature and at any operating conditions of an X-ray tube. This is achieved using high-frequency electric field (with frequency up to 10 MHz), which acts to increase concentration of dangling bonds in a crystal. The electric field amplitude is of the order of ~10-70 V/cm, and its frequency is of the order of 1-10 MHz. At the same time, the sample is exposed to X-ray radiation emitted by an X-ray tube with a Cu anode at a voltage of 10 kV. If the electric field frequency is 5 MHz, diffraction intensity decreases as generator voltage increases to 20 V (see FIG. 2). This shows that vacancies that are generated at the surface are gradually diffusing into the bulk of the crystal, similarly to FIG. 1. But when the generator voltage reaches 30 V, the observed abrupt decrease of diffraction intensity is as large as ~10%, and at 40 V the change increases up to ~50%. Thus, the broken chemical bonds cause a rapid change of lattice structure in 5-25 seconds. Those examples demonstrate the increase of the observed change of diffraction intensity with an increase of amplitude or frequency of voltage applied to the surface of the material. The change of diffraction intensity becomes larger because the electric field, which is applied to the material during the irradiation, breaks chemical bonds additionally. This change of diffraction intensity is accompanied by a significant change of the sample resistance (FIG. 3). As it is evident in FIG. 3, the additional breakage of chemical bonds causes an increase of free carrier concentration and conductivity by a factor of 1.5-5 and a corresponding decrease of resistivity. The energy of high-frequency electromagnetic field is transferred to chaotically oriented atomic nuclei (unlike in the standard method of nuclear magnetic resonance, no strong external magnetic field is applied) and at the same time is used to increase oscillation amplitude of lattice atoms. This causes rearrangement of electronic bonds in vacancies. Those bonds change abruptly due to resonance, so that concentration of charge carriers increases and resistivity decreases.

From the point of view of the doping technology, the mentioned fast diffusion of vacancies translates into shorter doping time, because, as mentioned, introduction of impurity atoms into a material is also a diffusion process, caused by random "jumps" of impurity atoms from lattice nodes into neighbouring vacancies (creating a vacancy in the node that was previously occupied by the mentioned atom). Hence, the total doping duration includes the time needed to saturate the material with vacancies that mediate the subsequent diffusion of impurities.

The mentioned resonances of dangling bonds, which exist at defect sites, under action of radio-frequency electric field, are fundamentally new phenomena. They can be investigated using novel experimental methods based on nonlinear diffusion theory in conjunction with electrical and Bragg diffraction measurements. The abrupt changes of electric conductivity and Bragg diffraction intensity can be explained by resonance electronic transitions from one quantum state to another. The resonances take place due to rearrangement of electronic bonds in the vicinity of defects, as the interaction of the electrons with the surrounding ions changes. Those changes are related to inharmonic oscillations of the mentioned ions, which are stimulated by interaction of nuclear magnetic moments with external AC electromagnetic field. This phenomenon is influenced by formation or destruction of chemical bonds at the defect sites due to pairing or separation of the dangling-bond electrons. As a result, when a sufficient time passes and a sufficient amount of energy is accumulated in the crystal lattice, changes of quantum states of defects and defect-oxygen complexes become possible, as well as changes of the sample electric conductivity. The changes of long-range spin-dependent electric bonds and vacancy relaxations cause changes of quantum states of inharmonic bonds between neighboring atoms and the relaxations of electronic transitions under action of alternating electric field.

X-ray-generated vacancies are long-lived (more than 1.5 h) at room temperature and can be applied in practice. Long-lived and fast-diffusing negative vacancies are the reason of phosphorus and boron superdiffusion in p-type silicon crystals at room temperature.

This type of superdiffusion can be used for promising technologies of manufacture of high-quality electronic devices (photodiodes, solar cells). A crystal or other materials obtained by applying this method of formation of excited defects can be used as a substrate for the low-temperature doping process.

DESCRIPTION OF CARRYING OUT THE INVENTION

The modern semiconductor industry relies on potential to change properties of materials by introduction of impurities and creation or elimination of structural defects in lattices. By using X-ray radiation to create metastable vacancies in the Si lattice (due to the Auger effect), the superdiffusion of boron and phosphorus ions via metastable vacancies in crystalline silicon at room temperature has been discovered experimentally. The resonances of dangling bonds under action of radio-frequency electric field are fundamentally new phenomena.

Figure 1:
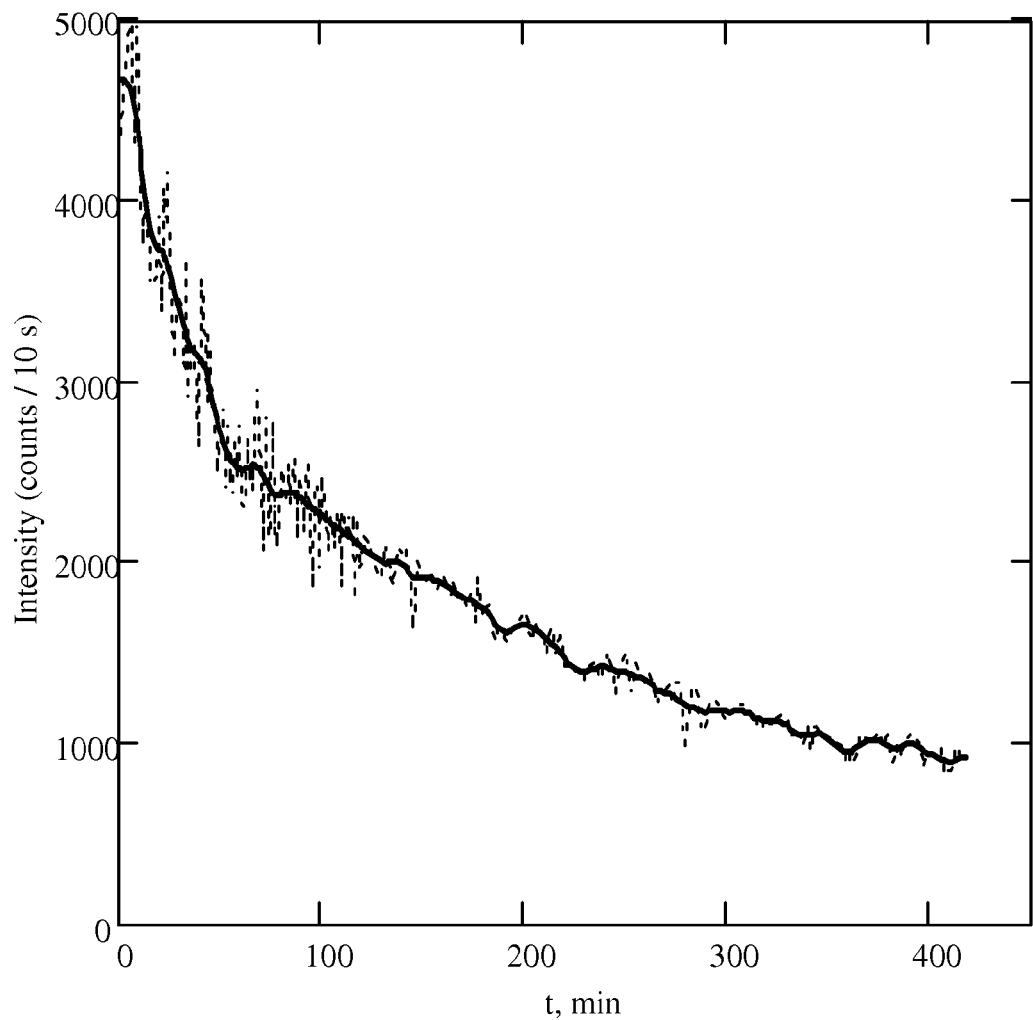
FIG. 1. Time dependence of intensity of the diffraction peak corresponding to reflection from Si (333) crystallographic planes of Cu $K_\alpha$ X-ray radiation.
Figure 2:
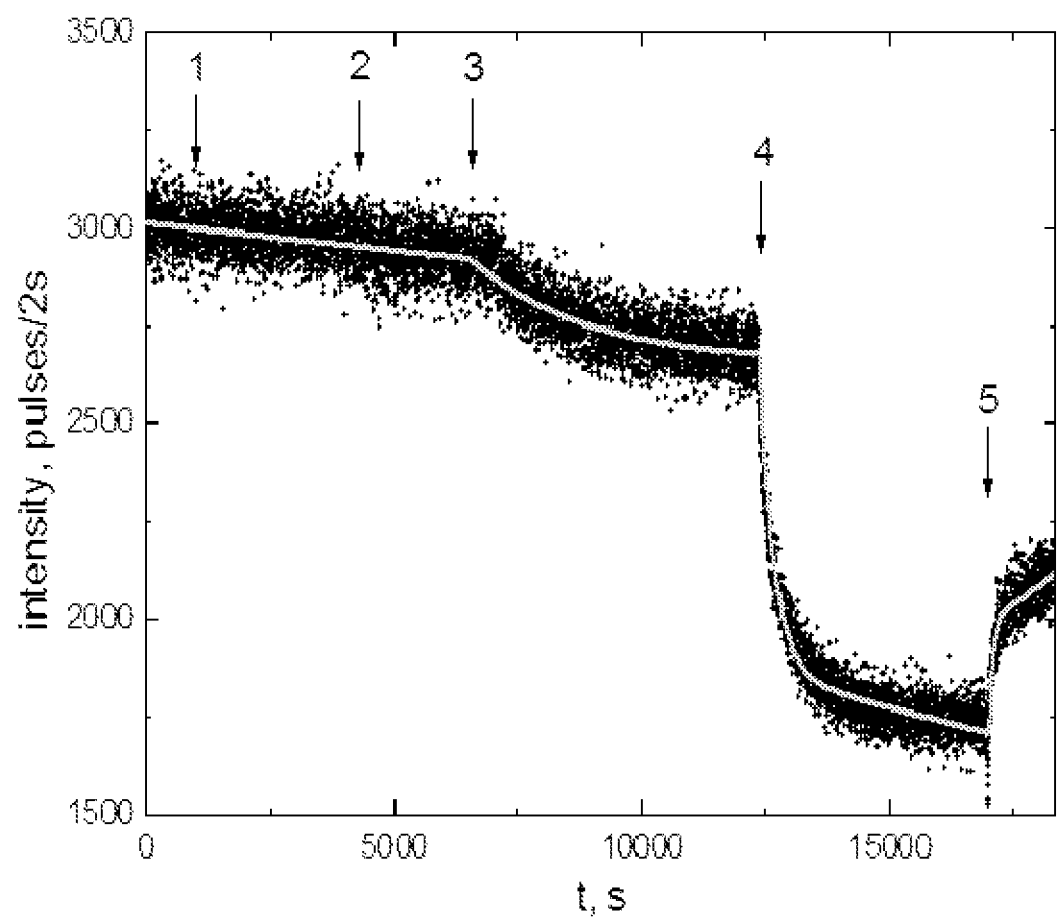
FIG. 2. Time dependence of intensity of the diffraction peak corresponding to reflection from (400) crystallographic planes, when there is electric field with frequency of 5 MHz. "1" corresponds to the moment of time when electric field with amplitude 10 V is switched on, "2" corresponds to the increase of the amplitude up to 20V, "3"—to 30V, "4"—to 40V, "5" corresponds to the moment of time when the electric field is switched off.
Figure 3:
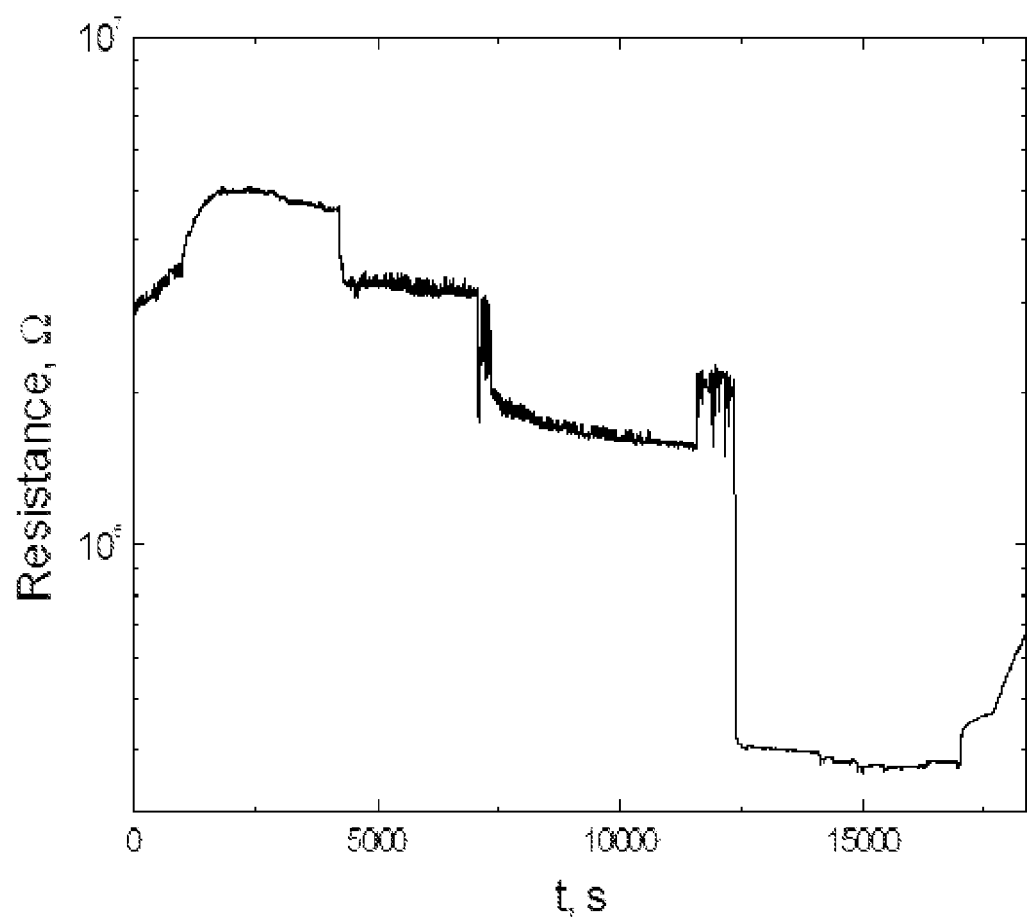
FIG. 3. Time dependence of resistance of the silicon sample, when there is electric field with frequency 5 MHz (measurement conditions are the same as in FIG. 2).

The goal of the invention is improvement of the technology of defect generation and deep doping of semiconductors at room temperature. This goal is achieved by using high-frequency electric field (with frequency in the megahertz range), which acts to increase concentration of dangling chemical bonds in the crystal. If the electric field frequency is 5 MHz, diffraction intensity decreases as generator voltage increases to 20 V (see FIG. 2). This shows that vacancies that are generated at the surface are gradually diffusing into the bulk of the crystal, similarly to FIG. 1. But when the generator voltage reaches 30 V, the observed abrupt decrease of diffraction intensity is as large as ~10%, and at 40 V the change increases up to ~50%. Thus, the broken chemical bonds cause a rapid change of lattice structure in 5-25 seconds. Those examples demonstrate the increase of the observed change of diffraction intensity with an increase of amplitude or frequency of voltage applied to the surface of the material. This change is accompanied by a significant change of the sample resistance (FIG. 3). The energy of high-frequency electromagnetic field is transferred to chaotically oriented atomic nuclei (unlike in the standard method of nuclear magnetic resonance, no strong external magnetic field is applied) and at the same time is used to increase oscillation amplitude of lattice atoms. This causes rearrangement of electronic bonds in vacancies. Those bonds change abruptly due to resonance, so that concentration of charge carriers increases and resistivity decreases.

X-ray-generated vacancies are long-lived (more than 1.5 h) at room temperature and can be applied in practice.

Experimental Measurement Results

The experiment was done using a 0.3 mm-thick monocrystalline silicon plate with aluminum electrodes (further referred to as "the sample"). The distance between the contacts was 6 mm. The sample width was 5 mm. The sample was isolated from ambient air and exposed to X-ray radiation of the diffractometer DRON-3M with a Cu anode at anode voltage 10 kV and anode current 24 mA. At the same time, intensity of the diffraction spectrum peak (400) (FIG. 2) and the change of the sample resistivity (FIG. 3) were being recorded. Duration of a single measurement was 2 s. During the exposure, AC voltage with frequency up to 10 MHz and amplitude up to 10 V was applied to the sample surface (the generator G3-112/1 was used as the voltage source).

The abrupt large decrease of intensity (down to 1% of the initial magnitude) at the moment of switching on the generator indicates a change of the lattice structure. Due to the Auger effect, the crystal structure changes into a metastable state, which is characterized by formation of vacancies, interstitial atoms and atoms with unsaturated bonds in the lattice. At the same time, electronic Tamm levels can form in the energy gap of the semiconductor. Those levels are localized on the crystal surface. Due to action of megahertz-range electromagnetic radiation upon electrons localized in those levels, the electrons are excited into the conductivity band, decreasing the resistivity by an order of magnitude. This effect increases with increasing amplitude and frequency of external voltage. At the same time, the number of intact chemical bonds decreases and Coulomb interaction between electric charges causes an increasing deformation of the crystal lattice.

INDUSTRIAL APPLICABILITY

The invention presents a new technique of defect formation, using X-ray radiation and high-frequency electric field, and application of thus obtained defects. The invention can be applied in semiconductor industry for manufacture of doped semiconductors for solar cells, photodiodes and other semiconductor devices. Semiconductor doping (i.e., introduction of impurity atoms into semiconductors) in accordance to our invention can be done much faster than using conventional methods. The invention makes it possible to carry out semiconductor doping at room temperature. Thus main the advantage of this invention is small expenditure of time and energy, which translate into smaller costs of manufacture of semiconductor devices. In comparison with other existing doping methods, which rely on semiconductor bombardment with fast particles (e.g., the method of fast-electron-stimulated superdiffusion, which is described in the mentioned article by Takao Wada and Hiroshi Fujimoto), this invention has the advantage of imparting less damage to the semiconductor crystal lattice (i.e., crystal atoms are not being knocked out of equilibrium positions).

The invention claimed is:

1. A method of formation of excited vacancy defects, comprising:
   exposure of a monocrystalline silicon sample to X-ray radiation of a Cu X-ray tube with anode voltage 10 kV, characterised by application of weak electric field with frequency of 5-10 MHz and amplitude of 10-70 V/cm to the sample during the irradiation.

2. The method of formation of excited defects in the monocrystalline silicon sample according to claim 1, characterised by an increase of free carrier concentration and conductivity by a factor of 1.5-5.

3. A method of obtaining a silicon crystal with changed properties by formation of excited vacancy defects, comprising:
   exposing a monocrystalline silicon sample to X-ray radiation of a Cu X-ray tube with anode voltage 10 kV, characterised by application of weak electric field with frequency of 5-10 MHz and amplitude of 10-70 V/cm to the sample during the irradiation.

4. In a method of manufacturing doped semiconductors for a process of manufacturing electronic devices, the improvement which comprises obtaining a silicon crystal with changed properties by formation of excited vacancy defects, by exposing a monocrystalline silicon sample to X-ray radiation of a Cu X-ray tube with anode voltage 10 kV, characterised by application of weak electric field with frequency of 5-10 MHz and amplitude of 10-70 V/cm to the sample during the irradiation, and using the thus-obtained crystal as a substrate.

5. The method of formation of excited vacancy defects of claim 1, wherein the application of the weak electric field is with frequency of 5-10 MHz and amplitude of 10 V/cm to the sample during the irradiation.

6. The method of formation of excited vacancy defects of claim 1, wherein the application of the weak electric field is with frequency of 5-10 MHz and amplitude of 20 V/cm to the sample during the irradiation.

7. The method of formation of excited vacancy defects of claim 1, wherein the application of the weak electric field is with frequency of 5-10 MHz and amplitude of 30 V/cm to the sample during the irradiation.

8. The method of formation of excited vacancy defects of claim 1, wherein the application of the weak electric field is with frequency of 5-10 MHz and amplitude of 40 V/cm to the sample during the irradiation.

9. The method of formation of excited vacancy defects of claim 1, wherein the application of the weak electric field is with frequency of 5-10 MHz and amplitude of 10-40 V/cm to the sample during the irradiation.

10. The method of formation of excited vacancy defects of claim 1, wherein the application of the weak electric field is with frequency of 5-10 MHz and amplitude of 20-40 V/cm to the sample during the irradiation.

* * * * *